United States Patent
Hirsekorn

(10) Patent No.: US 9,451,707 B2
(45) Date of Patent: Sep. 20, 2016

(54) STABILIZED SILVER CATALYSTS AND METHODS

(71) Applicant: Dow Global Technologies LLC, Midland, MI (US)

(72) Inventor: Kurt F. Hirsekorn, Midland, MI (US)

(73) Assignee: Dow Global Technologies LLC

(*) Notice: Subject to any disclaimer, the term of this patent is extended or adjusted under 35 U.S.C. 154(b) by 0 days.

(21) Appl. No.: 13/712,997

(22) Filed: Dec. 13, 2012

(65) Prior Publication Data

US 2014/0171296 A1 Jun. 19, 2014

(51) Int. Cl.
| | |
|---|---|
| *B01J 23/50* | (2006.01) |
| *C23C 18/16* | (2006.01) |
| *H05K 3/18* | (2006.01) |
| *C23C 18/18* | (2006.01) |
| *C23C 18/20* | (2006.01) |
| *C23C 18/30* | (2006.01) |
| *H05K 1/03* | (2006.01) |
| *H05K 3/38* | (2006.01) |

(52) U.S. Cl.
CPC ........... *H05K 3/181* (2013.01); *C23C 18/1653* (2013.01); *C23C 18/1893* (2013.01); *C23C 18/2086* (2013.01); *C23C 18/30* (2013.01); *H05K 1/0346* (2013.01); *H05K 3/387* (2013.01); *H05K 2201/0215* (2013.01); *H05K 2203/0709* (2013.01)

(58) Field of Classification Search
CPC ..... B01J 23/50; B01J 23/8966; C23C 18/16; C23C 18/31; C23C 18/2086; C23C 18/1893; C23C 18/1653; H05K 2201/0215; H05K 2203/0709; H05K 3/181
USPC ....... 502/167, 338, 347, 350, 352; 106/1.14, 106/1.15, 1.19, 1.23, 1.27; 205/126, 161, 205/163, 167, 187
See application file for complete search history.

(56) References Cited

U.S. PATENT DOCUMENTS

| | | | | |
|---|---|---|---|---|
| 3,674,827 | A | * | 7/1972 | Rao et al. ............... 560/342 |
| 5,165,971 | A | * | 11/1992 | Falletti .................. 427/443.1 |
| 8,591,636 | B2 | * | 11/2013 | Liu et al. ................ 106/1.11 |
| 2004/0043153 | A1 | | 3/2004 | Okuhama et al. |
| 2005/0266255 | A1 | * | 12/2005 | Kano .................. C08G 73/10 428/473.5 |
| 2006/0084705 | A1 | | 4/2006 | Caruso et al. |
| 2010/0279012 | A1 | * | 11/2010 | Sato ................. C23C 18/1608 427/256 |
| 2012/0145554 | A1 | * | 6/2012 | Liu et al. ................ 205/187 |
| 2014/0087062 | A1 | * | 3/2014 | Liu et al. ............... 427/98.1 |

FOREIGN PATENT DOCUMENTS

| | | | |
|---|---|---|---|
| JP | 2004-190066 | | 7/2004 |
| KR | 10-2013-0066551 | * | 6/2013 ............. C23C 18/18 |

OTHER PUBLICATIONS

"Crystallographic dependence of 4-dimethylaminopyridine electrosorption on gold," J. P. Vivek et al. Electrochimica Acta 88 (2013), pp. 688-696.*
Valeri J. Gandubert et al, "Assessment of 4-(Dimethylamino)pyridine as a capping agent for gold nanoparticles", Langmuir 2005, vol. 21, pp. 6532-6539.
Keith A. Flanagan, et al, "Preparation and characterization of 4-dimethylaminopyridine-stabilized palladium nanoparticles", Langmuir, 2007, vol. 23, pp. 12508-12520.
Eugenio Coronado, et al, "Synthesis, characterization and magnetism of monodispersed water soluble palladium nanoparticles", J. Mater. Chem., 2008, vol. 18, pp. 5682-5688.
Yutaka Fujiwara, et al., "Adsorption promotion of Ag nanoparticle using cationic surfactants and polyelectrolytes for electroless Cu plating catalysts", Journal of the Electrochemical Society, 2010, vol. 157(4), pp. D211-D216.

\* cited by examiner

*Primary Examiner* — Patricia L Hailey
(74) *Attorney, Agent, or Firm* — John J. Piskorski

(57) ABSTRACT

Zero-valent silver compositions include 4-dimethylaminopyridine as stabilizers. The zero-valent silver and the 4-diemthylaminopyridine form stabilized nano-particles in solution. The zero-valent silver compositions may be used as catalysts in the metallization of non-conductive substrates.

11 Claims, No Drawings

STABILIZED SILVER CATALYSTS AND METHODS

The present application claims priority from provisional application Ser. No. 61/569,462 filed Dec. 12, 2011.

FIELD OF THE INVENTION

The present invention is directed to stabilized silver catalysts and methods of electrolessly plating metal on non-conductive substrates. More specifically, the present invention is directed to stabilized silver catalysts and methods of electrolessly plating metal on non-conductive substrates where the silver catalyst is stabilized with 4-dimethylaminopyridine.

BACKGROUND OF THE INVENTION

During the manufacture of multi-layer printed wiring boards (PWBs), the assimilation of several patterned conductive copper layers requires separation by dielectric materials. To build interconnecting pathways between the copper layers, through-holes are drilled into which conductive material, copper, is plated to cover the dielectric material and connect the innerlayers of copper. Current methods for plating copper throughout the drilled holes involve making the through-holes conductive to enable subsequent electrolytic copper plating. The most common method of generating a conductive copper layer in the through-holes is electroless copper plating whereby formaldehyde is used as an electron source to reduce copper ions to copper metal within the through-holes. To direct the copper reduction to the walls of the through-holes, several processing steps ensure coating of the through-holes with catalyst material. Current catalyst solution baths, into which drilled multi-layer boards are dipped during processing, contain palladium as the active ingredient. The cost of palladium has increased dramatically over the years. Thus substitution of the palladium containing catalyst solution with an inexpensive alternative has been a goal of the electroless plating industry for some time.

While many non-palladium catalyst solutions are capable of initiating electroless copper plating, replicating the performance behavior of current commercial palladium systems has proven challenging. The most critical factors influencing the attractiveness of alternative catalyst solutions include: Stability—Catalyst solution baths must retain their activity over the course of several months in open air at process temperatures. Activity—Through-holes removed from the electroless plating baths, following exposure to the catalyst bath, must contain full and uniform copper coverage and be sufficiently conductive to enable electrolytic plating. If alternative catalyst solutions require substantial increases in cycle times, raw material cost benefits are likely to be offset by dramatic through-put reductions. Thus, alternative catalyst solutions must provide sufficient activity within the constraints of current process flows. Interconnect quality—Processed, post-electrolytic copper plating, multi-layer boards must possess sufficient electrical conductivity throughout the multi-channel copper containing pathways within the board. While a host of factors, such as poor drilling or insufficient through-hole preparation, may contribute to defects occurring at the interface of the copper layers and the conducting through-holes, defects inherent to the use of a particular catalyst are unacceptable.

The use of silver serves to address the raw material price and volatility issues facing current palladium based systems. While catalyst solutions based on silver have previously been reported, none have had commercial success due to failures in any one of the factors described above. Most typically, silver catalyst solutions fail to provide sufficient activity within the through-holes for electroless copper plating. This may either be a function of the amount of catalyst absorbed within the through-holes or the rate of initiation of electroless plating provided by the catalyst; in either case, the result is insufficient copper coverage within the through-holes for subsequent electrolytic plating. It is likely that many factors influence the activity provided by a particular silver catalyst solution, namely silver particle size, choice of stabilizing agent, and the presence of components such as pH buffers and other additives.

Patent publication U.S. 2004/0043153 to Okuhama et al. discloses a silver colloid solution produced by reducing a silver ion by an ion of a metal having an electric potential which can reduce the silver ion to silver metal. The solution also includes one or more ions selected from a hydroxycarboxylate ion, a condensed phosphate ion and an amine carboxylate ion. The silver colloid may also include one or more ions selected from the metals of atomic numbers 26 to 30. The patent publication discloses that the silver colloid may be used as a catalyst for electroless plating. Although there are silver colloids which may be used as catalysts for electroless plating, there is still a need for an improved silver catalyst to electrolessly plate metal on non-conductive substrates.

SUMMARY OF THE INVENTION

In one aspect a composition includes zero-valent silver, 4-dimethylaminopyridine and one or more ions of metals having an electrical potential which reduce silver ions to zero-valent silver.

In another aspect a method includes: (a) providing a substrate having a plurality of through-holes; (b) applying a composition including zero-valent silver, 4-dimethylaminopyridine and one or more ions of metals having an electrical potential which reduce silver ions to zero-valent silver to the surface of the through-holes; and then (c) electrolessly depositing a metal on the surface of the through-holes.

The zero-valent silver compositions including 4-dimethylaminopyridine are colloidal solutions where the zero-valent silver compositions form particles in the nanometer range. They are stable in open air at room temperature and at process temperatures. The zero-valent silver compositions enable substantial metal plating of through-holes with uniform metal deposits and the through-holes are sufficiently conductive to enable electrolytic through-hole plating. The zero-valent silver compositions also enable sufficient electrical conductivity throughout multi-channel metal containing pathways in PWBs.

DETAILED DESCRIPTION OF THE INVENTION

As used throughout this specification, the following abbreviations shall have the following meanings, unless the context clearly indicates otherwise: ° C.=degrees Celsius; g=gram; mg=milligram; L=liter; ml=milliliter; ppm=parts per million; μm=micron=micrometer; nm=nanometer; mm=millimeters; M=molar; mmol=millimolar; DI=deionized; $T_g$=glass transition temperature; R.T.=room temperature; rpm=revolutions per minute; ASD=amperes/$dm^2$; ASTM=American standard testing method; and PWB=printed wiring board or printed circuit board. All amounts are percent by weight ("wt %"), unless otherwise noted. All numerical ranges are inclusive and combinable in any order, except where it is clear that such numerical ranges are constrained to add up to 100%.

The term "through-holes" includes blind vias. Also as used throughout this specification, the term "plating" refers to electroless metal plating, unless the context clearly indicates otherwise. "Deposition" and "plating" are used interchangeably throughout this specification. "Halide" includes fluoride, chloride, bromide, and iodide. The articles "a" and "an" refer to the singular and the plural.

The compositions are aqueous and include a zero-valent silver metal, 4-dimethylaminopyridine as a stabilizer compound and one or more ions of metals having an electrical potential which reduce silver ions to zero-valent silver metal. The zero-valent silver metal and stabilizing 4-dimethylaminopyridine compound form colloidal solutions of stable nano-particles.

The water used in the present compositions may be any type, such as tap water or DI water. The zero-valent silver metal is present in the compositions in an amount of 25 to 1000 ppm, based on the weight of the composition. Preferably, the zero-valent silver is present in the composition in an amount of 50 to 500 ppm and more preferably from 100 to 250 ppm.

The stabilizing 4-dimethylaminopyridine compound is generally commercially available, such as from Sigma-Aldrich (St. Louis, Mo.), or may be prepared by methods known in the art. 4-diemthylaminopyridine is included in the zero-valent silver compositions in amounts of 0.15 g/L to 15 g/L, preferably from 1 g/L to 10 g/L.

The one or more ions of metals having an electrical potential which reduce silver ions to zero-valent silver metal include, but are not limited to tin ions, iron ions and titanium ions. Preferably divalent tin ions, divalent iron ion or divalent titanium ions are used to reduce silver ions to silver metal. More preferably divalent tin or divalent iron is used. Most preferably divalent tin is used.

Optionally, the present compositions may contain one or more of various additives common in electroless plating catalyst compositions, such as surfactants, buffers, pH adjusting agents, solubility aids such as organic solvents. Mixtures of various additives may be used, such as a pH adjusting agent and a buffer. Any suitable surfactants may be used, including anionic, non-ionic, cationic and amphoteric surfactants. Such surfactants may be present in an amount of from 0 to 25 ppm, based on the weight of the composition. When present, it is preferred that the amount of the surfactant is from 0.5 to 25 ppm and more preferably from 1 to 10 ppm. Buffering agents which may be used include, but are not limited to, carboxylic acids, such as citric acid, tartaric acid, succinic acid, malic acid, malonic acid, maleic acid, lactic acid, acetic acid and salts thereof; amines and salts thereof; and amino acids and salts thereof; and inorganic acids, such as boric acid, and their salts, and inorganic bases such as sodium bicarbonate. Compounds which may be used to adjust the pH include, but are not limited to, alkali metal hydroxides, such as sodium and potassium hydroxide, and acids such as mineral acids. When used, the optional buffering agents and pH adjusting agents are used in amounts sufficient to adjust the pH to a desired range.

Typically, the present compositions have a pH of 3-11. Preferably, the compositions have a pH of from 7 to 11, more preferably they have a pH of from 7 to 10.

The compositions are stable aqueous solutions of nanoparticles that are useful to catalyze electroless metal deposition in the manufacture of electronic components. By "stable" is meant that no precipitate formation is visually observed upon storage at room temperature for 3 months. Preferably, the present compositions show no precipitate after 6 months, and more preferably after 1 year storage at room temperature. The term "stable" also means that the aqueous solution of nanoparticles retain their catalytic activity at process temperatures. Typically process temperatures are from 20° C. and higher, preferably from 20° C. to 50° C. These nanoparticles may have a variety of particle sizes. If the particle sizes become too large, the compositions may not be stable, that is, precipitation may occur. Suitable average particle sizes may be from 1 nm to 500 nm, preferably from 1 nm to 250 nm, more preferably from 1 nm to 100 nm Particle sizes may be determined by known techniques, such as by light scattering or transmission electron microscopy.

The compositions of the present invention may be prepared by combining the 4-dimethylaminopyridine stabilizer compound, water, one or more water-soluble silver salts and one or more ions of metals having an electrical potential which reduce silver ions to zero-valent silver metal. Such ions are added as water-soluble salts. Preferably, the stabilizer compound, water, and the water-soluble silver salt are combined and then the silver reducing agent is added. The amount of reducing agent used is any amount sufficient to form the desired zero-valent silver metal. The stabilizer compound, water and water-soluble silver salt may be added in any order. Typically, the water-soluble silver salt is dissolved in an amount of water. This salt solution is then added to an aqueous solution of the stabilizing 4-dimethylaminopyridine agent. The mixture is then stirred, typically at room temperature and the pH is adjusted as needed. Typically, stir bar agitation may be used for small volumes, such as up to 200 ml. Homogenizers may be used for larger volumes. Typical mixing rates may be from 3000 to 25000 rpm. A POWERGEN™ 700 homogenizer by Fisher Scientific is an example of an apparatus which may be used. Next, one or more salts of the metal ion reducing agents are added to the mixture and stirring is continued. Following reduction, it is believed that stable nanoparticles comprising the stabilizing agent and the zero-valent silver are formed.

A variety of silver salts may be used provided that such silver salts are sufficiently water-soluble. A silver salt of an inorganic acid or an organic acid may be used. Such silver salts include, but are not limited to, silver nitrate, silver oxide, silver acetate, silver perchlorate, silver sulfite, silver citrate and silver organic sulfonate. The amount of silver salts used may vary depending on the water solubility of the particular silver salt. For example, silver salts may be used in amounts of 5 mg/L to 10 g/L, and preferably from 100 mg/L to 5 g/L.

A variety of tin, iron and titanium salts may be used to provide ions which reduce the silver ions to silver metal. Sources of tin ions include, but are not limited to salts, such as tin halides, tin sulfates, tin alkane sulfonates such as tin methane sulfonate, tin aryl sulfonate such as tin phenyl sulfonate, tin phenol sulfonate and tin toluene sulfonate and tin alkanol sulfonate. Preferably the tin compound is tin sulfate, tin chloride, tin alkane sulfonate or tin aryl sulfonate, and more preferably tin sulfate or tin methane sulfonate. Sources of iron ions include, but are not limited to, ferrous bromide, ferrous chloride, ferrous fluoride, ferrous sulfate, ferrous gluconate and ferrous lactate. Sources of titanium ions include, but are not limited to, titanium oxalate, titanium potassium fluoride, titanium sulfate and titanium potassium oxalate. Such metal salts are included in the compositions in amounts to reduce silver ions to silver metal and may be included in excess such that substantially all of the silver ions in the composition are reduced to silver metal, i.e., $Ag^0$. Such ions are included in the compositions in amounts of at least 0.1 g/L, preferably at least 1 g/L, more preferably 1 g/L to 20 g/L, still more preferably 2 g/L to 10 g/L.

One or more additional reducing agents which are not metal ions also may be included in the compositions to reduce silver ions to silver metal. A variety of such reducing agents may be used. Such reducing agents include, but are not limited to, hydrogen, glycols, compounds such as boron hydride compounds, such as amineboranes, such as dimethylamine borane (DMAB), trimethylamine borane, isopropylamineborane and morpholineborane, sodium borohydride and potassium borohydride, hypophosphorus acid, ammonium, lithium, sodium potassium and calcium salts thereof, aldehydes, such as formaldehyde, hypophosphites, such as sodium hypophosphite, hydrazine, hydrazine anhydride, carboxylic acids, such as formic acid and ascorbic acid, and reducing sugars, such as glucose, galactose, maltose, lactose, xylose and fructose. The amount of reducing agent used depends upon the amount of the silver salt in the composition. Typically, the reducing agents may be used in amounts of 5 mg/L to 500 mg/L, preferably in amounts of 20 mg/L to 200 mg/L.

Because the catalyst compositions contain a zero-valent silver, i.e., $Ag^0$, processes using these compositions avoid the need for a reducing step prior to electroless metal plating. In addition, the compositions enable good adhesion of metal to substrates. The problem with ionic silver particles growing in size and agglomerating and precipitating is also greatly reduced and preferably avoided altogether. Further, the acceleration step required when using tin is avoided in preparation of a substrate for metallization, thereby eliminating a conventional step in the preparation of non-conductive substrates for metallization.

Compositions of the invention may be used as catalysts in electroless metal plating of substrates which include inorganic and organic materials such as glass, ceramics, porcelain, resins, paper, cloth, and combinations thereof. Substrates also include metal-clad and unclad materials, such as printed circuit boards. Such printed circuit boards include metal-clad and unclad substrates with thermosetting resins, thermoplastic resins and combinations thereof, and may further include fibers, such as fiberglass, and impregnated embodiments of the foregoing. The temperatures and time periods for the method steps for metallization of the substrates are conventional and are well known in the art.

Thermoplastic resins include, but are not limited to: acetal resins; acrylics such as methyl acrylate, methyl methacrylate, ethyl acrylate, ethyl methacrylate, butyl acrylate and copolymers containing any of the foregoing; cellulosic resins such as cellulose propionate, cellulose acetate butyrate and cellulose nitrate; polyethers; nylon; polyethylene; polystyrene; styrene blends such as acrylonitrile styrene and copolymers and acrylonitrile-butadiene styrene copolymers; polycarbonates; polychlorotrifluoroethylene; and vinylpolymers and copolymers such as vinyl acetate, vinyl alcohol, vinyl butyral, vinyl chloride, vinyl chloride-acetate copolymer, vinylidene chloride and vinyl formal.

Thermosetting resins include, but are not limited to, allyl phthalate, furane, melamine-formaldehyde, phenol-formaldehyde and phenol-furfural copolymers, alone or compounded with butadiene acrylonitrile copolymers or acrylonitrile-butadiene-styrene copolymers, polyacrylic esters, silicones, urea formaldehydes, epoxy resins, allyl resins, glyceryl phthalates and polyesters.

The present compositions may be used to catalyze both low and high $T_g$ resins. Low $T_g$ resins have a $T_g$ below 160° C. and high $T_g$ resins have a $T_g$ of 160° C. and above. Typically, high $T_g$ resins have a $T_g$ of 160° C. to 280° C. or such as from 170° C. to 240° C. High $T_g$ polymer resins include, but are not limited to, polytetrafluoroethylene ("PTFE") and PTFE blends. Exemplary blends include PTFE with polypheneylene oxides and cyanate esters. Other classes of polymer resins which include high $T_g$ resins are epoxy resins, such as difunctional and multifunctional epoxy resins, bimaleimide/triazine and epoxy resins (BT epoxy), epoxy/polyphenylene oxide resins, acrylonitrile butadienestyrene, polycarbonates (PC), polyphenylene oxides (PPO), polypheneylene ethers (PPE), polyphenylene sulfides (PPS), polysulfones (PS), polyamides, polyesters such as polyethyleneterephthalate (PET) and polybutyleneterephthalate (PBT), polyetherketones (PEEK), liquid crystal polymers, polyurethanes, polyetherimides, epoxies and composites thereof.

The compositions may be used to deposit the zero-valent silver on the walls of through-holes. These compositions may be used in both horizontal and vertical processes of manufacturing PWBs.

Through-holes are generally formed in a PWB by drilling or punching or any other method known in the art. After the formation of the through-holes, the boards are optionally rinsed with water and a conventional organic solution is used to clean and degrease the board followed by desmearing the through-hole walls. Desmearing is well-known in the art and typically desmearing of the through-holes begins with application of a solvent swell.

Solvent swells are well-known in the art and conventional solvent swells may be used to desmear the through-holes. Such solvent swells, typically include, without limitation, glycol ethers and their associated ether acetates. Conventional amounts of glycol ethers and their associated ether acetates may be used. Examples of commercially available solvent swells which may be used are CIRCUPOSIT™ conditioner 3302, CIRCUPOSIT™ hole prep 3303 and CIRCUPOSIT™ hole prep 4120, all commercially available from Dow Electronic Materials, Marlborough, Mass.

Optionally, the through-holes are next rinsed with water. An oxidizer is then typically applied to the through-holes. Suitable oxidizers include, but are not limited to, sulfuric acid, chromic acid, alkaline permanganate or by plasma etching. Typically alkaline permanganate is used as the oxidizer. An example of a commercially available oxidizer is CIRCUPOSIT™ promoter 4130 commercially available from Dow Electronic Materials.

Optionally, the through-holes are rinsed again with water. A neutralizer is then typically applied to the through-holes to neutralize any acid residues or basic residues left by the oxidizer. Conventional neutralizers may be used. Typically, the neutralizer is an aqueous alkaline solution containing one or more amines or a solution of 3 wt % peroxide and 3 wt % sulfuric acid. Optionally, the through-holes are rinsed with water and the boards are dried.

After the neutralization step, the substrate (such as a PWB having through-holes) is conditioned by applying an alkaline conditioner to the substrate. Such alkaline conditioners include, but are not limited to, aqueous alkaline surfactant solutions containing one or more quaternary amines and polyamines and one or more surfactants. While the surfactants used are conventionally cationic surfactants, other surfactants, such as anionic, nonionic and amphoteric, may be used, as well as combinations of surfactants. In addition, pH adjusters or buffers also may be included in the conditioners. Typically, cationic surfactants are combined with non-ionic surfactants. Surfactants may be present in the conditioners in amounts of 0.05 to 5 wt %, and preferably from 0.25 to 1 wt %. Commercially available alkaline conditioners include, but are not limited to, CIRCUPOSIT™ conditioner 231, 813 and 860, each available from Dow Electronic Materials. Optionally, the through-holes are rinsed with water after conditioning.

Cationic surfactants include, but are not limited to, tetra-alkylammonium halides, alkytrimethylammonium halides, hydroxyethyl alkyl imidazoline, alkylbenzalkonium halides, alkylamine acetates, alkylamine oleates and alkylaminoethyl glycine.

Non-ionic surfactants include, but are not limited to, aliphatic alcohols such as alcohol alkoxylates. Such aliphatic alcohols have ethylene oxide, propylene oxide, or combinations thereof, to produce a compound having a polyoxyethylene or polyoxypropylene chain within the molecule, i.e., a chain composed of recurring ($-O-CH_2-CH_2-$) groups, or a chain composed of recurring ($-O-CH_2-CH-CH_3$) groups, or combinations thereof. Typically such alcohol alkoxylates are alcohol ethoxylates having carbon chains of 7 to 15 carbons, linear or branched, and 4 to 20 moles of ethoxylate, typically 5 to 40 moles of ethoxylate and more typically 5 to 15 moles of ethoxylate. Many of such alcohol alkoxylates are commercially available. Examples of commercially available alcohol alkoxylates are linear primary alcohol ethoxylates such as NEODOL 91-6, NEODOL 91-8 and NEODOL 91-9 ($C_9$-$C_{11}$ alcohols having an average of 6 to 9 moles of ethylene oxide per mole of linear alcohol ethoxylate) and NEODOL 1-73B ($C_{11}$ alcohol with an average blend of 7 moles of ethylene oxide per mole of linear primary alcohol ethoxylate), all commercially available from Shell Chemicals.

Anionic surfactants include, but are not limited to, alkylbenzenesulfonates, alkyl or alkoxy napthalenesulfonates, alkyldiphenyl ether sulfonates, alkyl ether sulfonates, alkylsulfuric esters, polyoxyethylene alkyl ether sulfuric esters, polyoxyethylene alkyl phenol ether sulfuric esters, higher alcohol phosphoric monoesters, polyoxyalkylene alkyl ether phosphoric acids (phosphates) and alkyl sulfosuccinates.

Amphoteric surfactants include, but are not limited to, 2-alkyl-N-carboxymethyl or ethyl-N-hydroxyethyl or methyl imidazolium betaines, 2-alkyl-N-carboxymethyl or ethyl-N-carboxymethyloxyethyl imidazolium betaines, dimethylalkyl betaines, N-alkyl-β-aminopropionic acids or salts thereof and fatty acid amidopropyl dimethylaminoacetic acid betaines.

The conditioning step is followed by micro-etching the through-holes. Conventional micro-etching compositions may be used. Micro-etching provides a micro-roughened copper surface on exposed copper (for example, innerlayers) to enhance subsequent adhesion of deposited electroless and electroplated metal. Micro-etches include, but are not limited to, 60 g/L to 120 g/L sodium persulfate or sodium or potassium oxymonopersulfate and sulfuric acid (2%) mixture, or a sulfuric acid/hydrogen peroxide mixture. An example of a commercially available micro-etching composition is CIRCUPOSIT™ microetch 3330 available from Dow Electronic Materials. Optionally, the through-holes are rinsed with water.

Optionally, a pre-dip is then applied to the micro-etched through-holes. Examples of pre-dips include 2% to 5% hydrochloric acid or an acidic solution of 25 g/L to 75 g/L sodium chloride. Optionally, the through-holes are rinsed with cold water.

The zero-valent silver aqueous colloidal composition is then applied to the through-holes to function as a catalyst for electroless metal deposition. The aqueous composition is applied to the through-holes at process temperatures. Typically the aqueous composition is applied to the through-holes at temperatures of at least 20° C., preferably from 20° C. to 50° C., more preferably from 20° C. temperature to 40° C. The through-holes optionally may be rinsed with water after application of the catalyst.

The walls of the through-holes are then plated with a metal, such as copper, nickel or an alloy of copper or nickel using an electroless metal plating bath. Conventional electroless baths including immersion baths may be used. Such baths are well known in the art. Typically the printed wiring board is placed in an electroless or immersion metal plating bath containing the metal ions of the desired metal to be deposited on the walls of the through-holes. Metals which may be deposited on the walls of the through-holes include, but are not limited to, copper, nickel, gold, silver and copper/nickel alloys. A layer of gold or silver finish using immersion gold or silver may also be deposited over a copper, copper/nickel or nickel deposit on the walls of the through-holes. Preferably, copper, gold or silver is deposited on the walls of the through-holes, and more preferably copper is deposited on the walls of the through-holes.

After the metal is deposited on the walls of the through-holes, the through-holes are optionally rinsed with water. Optionally, anti-tarnish compositions may be applied to the metal deposited on the walls of the through-holes. Conventional anti-tarnish compositions may be used. An example of an anti-tarnish composition is ANTI TARNISH™ 7130 composition, commercially available from Dow Electronic Materials. The through-holes may optionally be rinsed by a hot water rinse and then the boards may be dried.

After the through-holes are metal plated with the electroless or immersion metal baths, the substrates may undergo further processing. Further processing may include conventional processing by photoimaging and further metal deposition on the substrates such as electrolytic metal deposition of, for example, copper, copper alloys, tin and tin alloys. Conventional electrolytic metal baths may be used. Such baths are well known in the art.

The present compositions form a stable 4-dimethylaminopyridine aqueous colloidal solution of zero-valent silver nanoparticles which may be used to catalyze electroless metal deposition of non-conductive substrates, particularly substrates used in the manufacture of electronic components. In addition, the compositions enable good adhesion of metal to substrates. The problem with zero-valent silver metal particles growing in size and agglomerating and precipitating is also greatly reduced, and preferably eliminated. Since palladium is excluded from the composition, the cost of the catalyst is reduced. The stable silver compositions may be applied to the substrate without the need for a prior conditioning step and the acceleration step required when using conventional tin/palladium is also avoided in preparation of a substrate for metallization, thus two conventional steps can be eliminated in the preparation of substrates for metallization. Further, the silver compositions are stable in open air at room temperature and at process temperatures. The zero-valent silver compositions enable substantial metal plating of through-holes with uniform metal deposits and the through-holes are sufficiently conductive to enable electrolytic through-hole plating. The zero-valent silver compositions also enable sufficient electrical conductivity throughout multi-channel metal containing pathways in PWBs.

Some embodiments of the invention are described in detail in the following Examples.

Example 1

Preparation of Activating Bath

Into a 1 L glass beaker containing 700 mL of deionized water was added 13.6 g 4-diemthylaminopyridine and 9 g potassium phosphate monobasic. The solution was stirred rigorously at room temperature and the pH was adjusted to 7 via addition of 1 M potassium hydroxide solution. 6 g tin(II) sulfate were added with continued mixing for five minutes. A white precipitate was removed via filtration using a 1.5 micron G6 Fisher Glass Fiber filter followed by dropwise addition of 40 mL of 73.6 mmol silver nitrate solution in deionized water while the solution was mixed with a homogenizer at 6000 rpm. Addition of the silver solution led to an immediate color change to dark red-brown. The pH of the resulting solution of 300 ppm silver metal was raised from 7 to 9 with addition of 1 M potassium hydroxide solution. Absorption of the activating solution onto a lacey carbon support and subsequent analysis by high resolution transmission electron microscopy (TEM) revealed that the solution contained crystalline silver nanoparticle spheres of 5 nm diameter.

Example 2

Through-hole Screening Procedure

Six boards of pre-drilled eight layer multi-layer laminates of the types NP-175, TU-752, Shengyi 1000-2, Shengyi-1141, FR-406, 370 HR were provided. The pre-drilled through-holes had a diameter of 10 mm. The boards were processed through the work-flow described below.

1. The through-holes of each board were desmeared with CIRCUPOSIT™ MLB Conditioner 211 (available from Dow Electronic Materials) for 7 minutes at 80° C. and rinsed for 4 minutes with cold tap water.

2. The through-holes were then treated with PROMOTER™ 213 alkaline permanganate formulation (available from Dow Electronic Materials) at 80° C. for 10 minutes and rinsed for 4 minutes with cold tap water.

3. The though-holes in the boards were then treated with NEUTRALIZER™ 213 composition (available from Dow Electronic Materials) a mixture of hydrogen peroxide and sulfuric acid at 46° C. for 5 minutes and rinsed with cold tap water.

4. After desmear the through-holes were then prepared for plating by conditioning with 3 volume % CONDITIONER™ 231 alkaline conditioner (available from Dow Electronic Materials) at 40° C. for 5 minutes and then rinsed with cold tap water.

5. The through-holes of each board were then micro-etched with PREPOSIT™ 748 aqueous alkaline solution (available from Dow Electronic Materials) containing ammonium persulfate at 22° C. for 2 minutes followed by rinsing for 4 minutes with cold tap water.

6. A pre-dip of 2% by volume of aqueous hydrochloric acid was then applied to the through-holes for 1 minute at room temperature and then rinsed with cold tap water for 1 minute.

7. The through-holes were then treated with the zero-valence silver catalyst described in Example 1 above at 40° C. for 5 minutes followed by rinsing with cold tap water for 4 minutes.

8. The walls of the through-holes of the boards were then plated with electroless copper for 15 minutes at 38° C. using CIRCUPOSIT™ 880 electroless copper bath (available from Dow Electronic Materials).

Upon completion of electroless deposition, samples of all six laminate materials were ground using a conventional grinding process to expose the middle of the through-holes and mounted on a light microscope for inspection of the copper coverage throughout the through-holes. A total of ten through-holes were inspected for each of the six laminates for a total of 60 through-holes. Copper coverage was complete and uniform throughout each of the holes inspected.

The multi-layer boards were then acid washed with 10% sulfuric acid at 22° C. for 2 minutes and then each board was placed in a bath of ELECTROPOSIT™ EP-110B-3 copper electroplating bath (available from Dow Advanced Materials). The temperature of the bath was 25° C. Each board was connected to a conventional rectifier and the anode was a soluble copper electrode. Electroplating was done for 2 hours at a current density of 2 ASD.

After electroplating, the multi-layer boards were baked in an oven at 125° C. for 10 hours and subjected to ASTM thermal stressing by floating in a 63%/37% tin/lead solder pot at 288° C. for 10 seconds. The boards were floated six times on the same side of the board with a two minute cool down in between floats. The boards were then ground to expose the middle of the through-holes and inspected using a light microscope for the presence of interconnect defects (ICD) which were manifested as discontinuities between the electrolessly plated copper innerlayers and the electroplated through-holes. In total, 1,440 interconnections, 240 for each of the six laminates, were inspected and only one defect was observed. The connection between the electroless copper inner-layer and the through-hole remained intact despite deformation or canting of the inner-layer during thermal stressing, highlighting good adhesion.

What is claimed is:

1. A composition comprising zero-valent silver, 4-dimethylaminopyridine and tin ions having an electrical potential which reduce silver ions to zero-valent silver.

2. The composition of claim 1, wherein the composition has a pH 3 to 11.

3. The composition of claim 1, wherein the zero-valent silver is in amounts of 25 ppm to 1000 ppm.

4. The composition of claim 1, wherein the 4-dimethylaminopyridine is in amounts of 0.15 g/L to 15 g/L.

5. The composition of claim 1, further comprising one or more of iron ions and titanium ions.

6. The composition of claim 1, wherein the tin ions are in amounts of 1 g/L to 20 g/L.

7. A method comprising:
  (a) providing a substrate having a plurality of through-holes;
  (b) applying the composition of claim 1 to the surface of the through-holes; and then
  (c) electrolessly depositing a metal on the surface of the through-holes.

8. The method of claim 7, further comprising a step of electrolytically depositing a second metal onto the electrolessly deposited metal of step (c).

9. The method of claim 7, further comprising the step of contacting the surface of the through-holes with a oxidizing agent prior to step (b).

10. The method of claim 7, further comprising the step of contacting the surface of the through-holes with a surfactant prior to step (b).

11. The composition of claim 1, wherein the tin ions are divalent tin ions.

* * * * *